(12) United States Patent
Summerland

(10) Patent No.: US 11,664,718 B2
(45) Date of Patent: May 30, 2023

(54) TRANSISTOR DEVICE

(71) Applicant: Know Moore LTD., Nottingham (GB)

(72) Inventor: David Summerland, Nottingham (GB)

(73) Assignee: Know Moore, Ltd., Nottingham (GB)

( * ) Notice: Subject to any disclaimer, the term of this patent is extended or adjusted under 35 U.S.C. 154(b) by 0 days.

(21) Appl. No.: 16/969,111

(22) PCT Filed: Feb. 12, 2019

(86) PCT No.: PCT/GB2019/050374
§ 371 (c)(1),
(2) Date: Aug. 11, 2020

(87) PCT Pub. No.: WO2019/155239
PCT Pub. Date: Aug. 15, 2019

(65) Prior Publication Data
US 2021/0036598 A1 Feb. 4, 2021

(30) Foreign Application Priority Data

Feb. 12, 2018 (GB) .................................... 1802281
Apr. 24, 2018 (GB) .................................... 1806673
(Continued)

(51) Int. Cl.
*H02M 1/08* (2006.01)
*H02K 11/33* (2016.01)
(Continued)

(52) U.S. Cl.
CPC .......... *H02M 1/08* (2013.01); *H01L 27/1026* (2013.01); *H02K 11/33* (2016.01); *H03K 17/18* (2013.01);
(Continued)

(58) Field of Classification Search
CPC .... H01L 27/1026; H02K 11/33; H03K 17/18; H03K 2217/0027; H03K 2217/0081; H02M 7/5387; H02M 1/08
See application file for complete search history.

(56) References Cited

U.S. PATENT DOCUMENTS 6,366,153 B1 * 4/2002 Arslain .............. H03K 17/0822
327/512
9,947,379 B1 * 4/2018 El Gabaly Marquez ....................
H01L 27/112
(Continued)

FOREIGN PATENT DOCUMENTS

| EP | 3812266 A1 * | 4/2021 | ............. B64C 15/00 |
| JP | 2015510382 | 4/2015 | |
| JP | 2016178183 | 10/2016 | |

*Primary Examiner* — Metasebia T Retebo
(74) *Attorney, Agent, or Firm* — Fleit Intellectual Property Law; Jose Gutman

(57) ABSTRACT

A transistor device includes a transistor and programmable controller. The controller has an output that controls operation of the transistor. The controller includes analog computing circuitry and optionally digital computing circuitry that may be used to setup the analog computing circuitry. In addition to two connectors for connecting the transistor into an external circuit, the device includes a further connector that provides an input to the controller and through which the control can be programmed post manufacture. The transistor device may be a discrete component in which transistor and controlling circuitry are held in packaging, the three connectors exposed through the packaging in order to connect the device to an external circuit.

17 Claims, 9 Drawing Sheets

(30) Foreign Application Priority Data

| May 30, 2018 | (GB) | ................................ | 1808840 |
| May 31, 2018 | (GB) | ................................ | 1808960 |
| Oct. 12, 2018 | (GB) | ................................ | 1816688 |
| Oct. 22, 2018 | (GB) | ................................ | 1817199 |

(51) Int. Cl.
*H10B 69/00* (2023.01)
*H03K 17/18* (2006.01)
*H01L 27/102* (2023.01)

(52) U.S. Cl.
CPC ............... *H03K 2217/0027* (2013.01); *H03K 2217/0081* (2013.01)

(56) References Cited

U.S. PATENT DOCUMENTS

| 2012/0212075 | A1* | 8/2012 | Arnet | H02M 1/08 |
| | | | | 307/113 |
| 2016/0005732 | A1* | 1/2016 | Wood | H01L 29/7392 |
| | | | | 257/163 |
| 2016/0013655 | A1 | 1/2016 | Zeltner et al. | |
| 2016/0043710 | A1* | 2/2016 | Crandall | H03F 3/24 |
| | | | | 327/374 |
| 2017/0126215 | A1* | 5/2017 | Crandall | H03K 3/356104 |
| 2020/0250519 | A1* | 8/2020 | Cao | G06N 3/049 |

\* cited by examiner

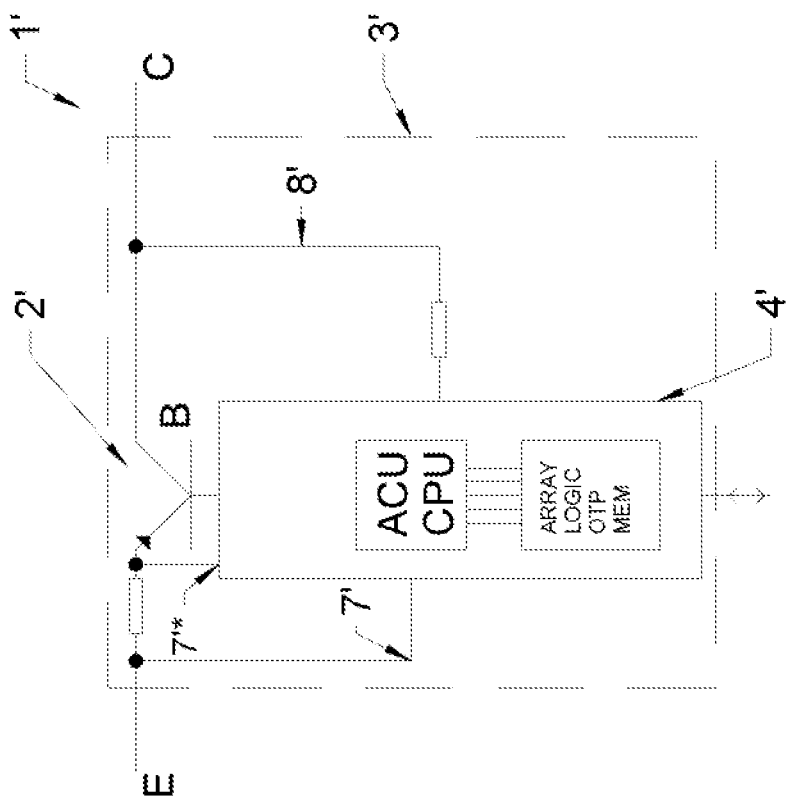
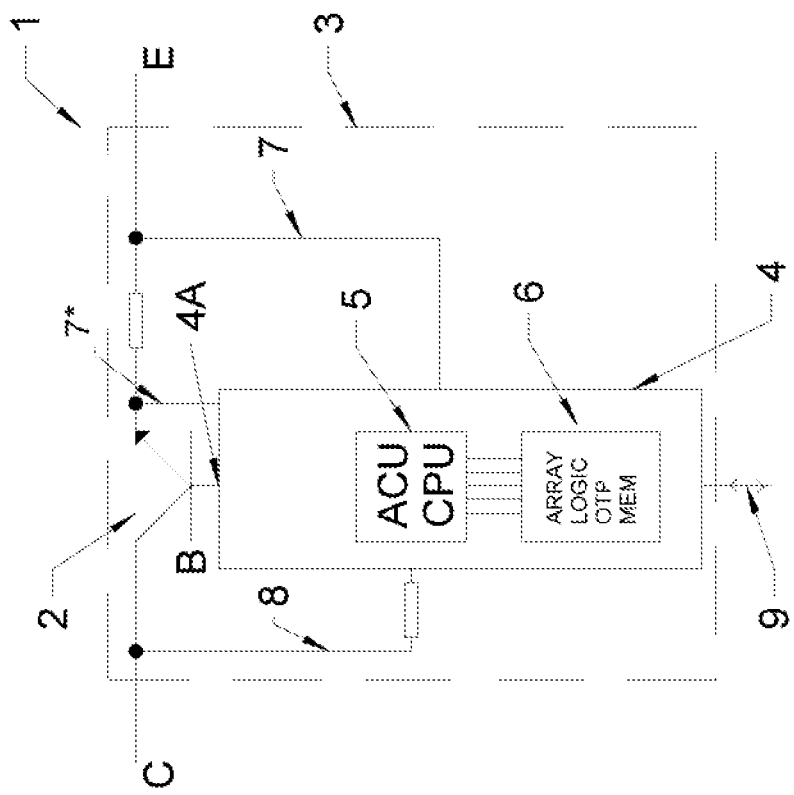

TRANSISTOR DEVICE

BACKGROUND

The present application relates to a transistor device. In one application the transistor device may be employed as a power management integrated circuit device.

In certain applications, such as power integrated circuits, it is desirous to provide both high voltage electronic elements with low voltage electrical elements on a single semiconductor chip.

https://www.digikey.com/en/articles/techzone/2016/may/smart-high-side-drivers-help-meet-tough-new-automotive-standards, US2005017688, US2008117125, U.S. Pat. No. 9,735,768 and US2017317001 each disclose devices that include a transistor whose operated by a control mechanism.

BRIEF SUMMARY

According to a first aspect of the invention there is provided a, favorably discrete, semiconductor transistor device comprising: a transistor having a first terminal and a second terminal for connecting the transistor into an external circuit in order to control current flow through said circuit, and a control terminal; a controller circuitry favorably comprising computing circuitry, having an output that is connected to a control terminal of the transistor in order to control operation of the transistor. The controller circuitry favorably comprises at least one input to allow the transistor device to receive a control and/or data signal from an external source. The controller circuitry is favorably programmable via the at least one input.

The invention thereby provides an 'intelligent' switch or amplifier that can be used, alone or in combination with others instead of a microcontroller. An example application is use in a power adaptor circuit. Providing controller circuitry that is programmable subsequent to the device's manufacture means the device's function can be chosen subsequent to manufacture by a user depending upon the application required.

The transistor device preferably comprises a bipolar junction transistor having an emitter, a collector and a base. As such, the controller circuitry may have an output that is connected to the base of the bi-polar-junction transistor in order to control operation of the bipolar-junction transistor.

The controller circuitry may comprise a computer readable memory. The memory may be used to hold algorithmic information, e.g., for a multiple stepped algorithm to be implemented by the controller circuitry.

The computer readable memory may be non-volatile. The computer readable memory is favorably programmable subsequent to its manufacture. The computer readable memory may comprise ROM and/or PROM.

The controller circuitry, e.g., controller computing circuitry, may comprise analog computing circuitry. Analog computing circuitry is advantageous because it can operate significantly faster than digital computing circuitry, resolve instantaneously and be implemented from substantially fewer transistors.

Nevertheless, the controller circuit may comprise digital computing circuitry, either alone or usually more favorably together with analog computing circuitry.

The digital computing circuitry may be programmable to select the setup of the analog computing circuitry. The digital computing circuitry may include the computer readable memory which could be one time programmable memory or reprogrammable memory.

The controller circuitry is favorably arranged to perform calculations using an input to the controller circuitry and use the result of the calculations to control the operation of the transistor.

The controller circuitry may have inputs connected to one or both sides of the transistor, e.g., the controller circuitry may have inputs connected to an emitter side of the transistor and a collector side of the transistor in order to receive an indication of current through the transistor and an indication of voltage. The controller circuitry may receive an indication of the voltage at either of the collector or emitter (e.g., relative to ground or some other reference point, e.g. voltage across the emitter and collector).

Analog signals received through one or both of these inputs may be used by the controller circuitry to control the function of the transistor. Analog signals received through one or both of these inputs may be operated on by the analog computing circuitry, digital computing circuitry or both to provide an output to control the transistor.

The controller circuitry may comprise at least one port to allow the transistor device to receive control and/or data signals from an external circuit or device. The port may be bi-direction so as to allow the transistor device to also output signals to an external device or circuit.

For example the port may be connected to capacitor in order to provide a timing function. The capacitor could be an integrated component formed on the monolith or an external component.

The device may comprise a single semiconductor monolith on which the transistor and the controller circuitry are fabricated; a housing (e.g. molding) that encases the monolith, and connectors (e.g. pin connectors that protrude from the housing) to provide connection to the first and second terminals, and where present, the port of the controller circuitry.

It is possible, however, in certain embodiments that the transistor and controller circuitry be formed on separate monoliths encased in the housing (e.g. molding). The transistor semiconductor device may be used unpackaged, i.e., without housing.

In various arrangements, the transistor is substantially larger (e.g. has a substantially larger lateral length) than the electrical components that form the controller circuitry. This allows the transistor to handle relatively large voltage/powers whilst the electrical components that form the controller circuitry can be relatively small in order to keep the total size of the device to a minimum.

As such, the transistor may be a relatively high voltage transistor adapted to be connected via the first and second terminals into, and so as to control current flow through, a relatively high voltage circuit, and the controller circuitry adapted to operate with relatively low voltage signals. For example, the high voltage circuit may operate above 20V and the low voltage signals may be below 20V, e.g., under 12V.

A semiconductor region that provides a collector or emitter region (where a BJT transistor) may be substantially thicker that the semiconductor region that provides the base region, favorably at least ten times thicker, in order that the transistor can operate at a substantially higher voltage than the relative small electronic components forming the controller circuitry that being formed in the relative thinner base region allows for their lateral size to be minimized.

In another aspect there is provided a semiconductor device comprising multiple transistor devices formed on a single monolith, each having a first terminal and a second terminal and a control terminal; each of the multiple transistors have separate controller circuitry associated therewith, each of the separate controller circuitry having an output that is connected to the control terminal of its respective transistor in order to control operation of its respective transistor. The individual controllers may have multiple connections therebetween.

BRIEF DESCRIPTION OF THE SEVERAL VIEWS OF THE DRAWINGS

The invention will now be described by way of example with reference to the following figures in which:

FIG. 1 is a schematic of a NPN bipolar junction transistor device;

FIG. 2 is a schematic of a PNP bipolar junction transistor device;

DETAILED DESCRIPTION

Figure 3:
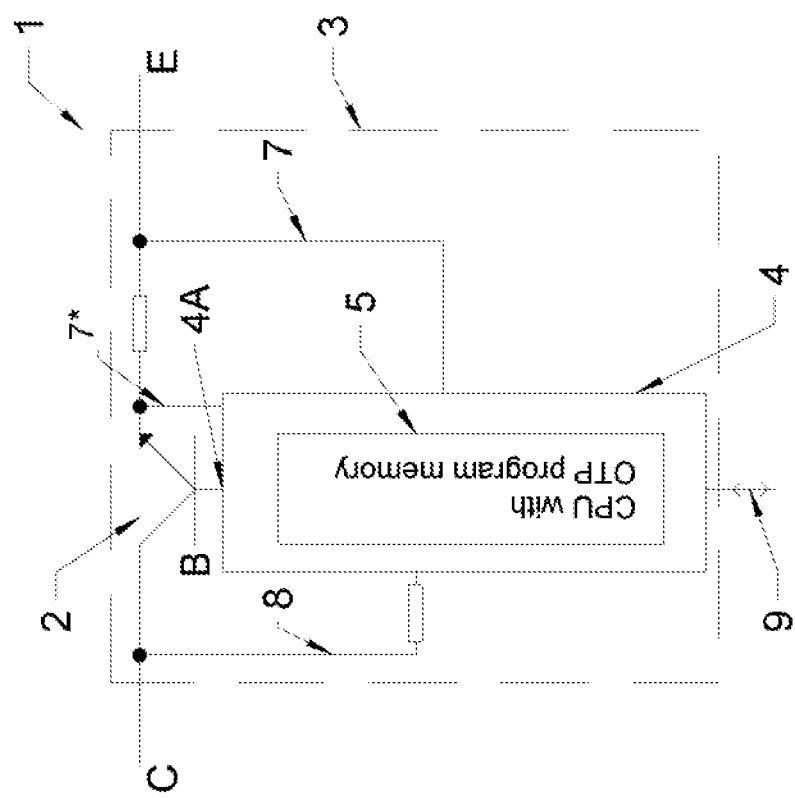
FIG. 3 is a schematic of a variant NPN bipolar junction transistor device comprising only analog computing circuitry programmed to provide the function of a PID controller.

With reference to FIG. 1 there is shown a schematic of a transistor device 1 that can be a discrete electronic component or one of a number of electronic components of an integrated circuit.

The device 1 comprises a NPN bipolar junction transistor (BJT) 2 formed on a semiconductor chip 3, the BJT 2 having an emitter terminal E, collector terminal C and base terminal B.

Also formed on the chip 3 are further electronic elements that provide controller circuitry 4 having an output 4A that is connected to the base terminal B of the BJT 2 in order to control the functioning of the BJT 2

The controller circuitry 4 has ports 7, 7* and 8. Ports 7, 7* connect across a resistor on the emitter side of the BJT 2 in order to receive an analog signal indicative of the current through the BJT 2.

Port 8 connects to the collector side of the BJT 2 in order to receive an analog signal indicative of the voltage at the collector side of the BJT relative to ground (or some other reference point). In the example of FIG. 1, voltage may be referenced to port 7 to give a voltage across the collect C and emitter E.

The controller circuitry 4 has a further port 9 for receiving signals, e.g. control signals from an external source. The further port 9 may act as a two-way port for both receiving signals and transmitting signals from the controller circuitry 4.

The controller circuitry 4 comprises analog computing circuitry 5 and digital computing circuitry 6, which in this example provides the functions of programmable logic circuits and a one-time programmable memory. The digital circuitry 6 is adapted to program (i.e. select circuit elements or sub-circuits of) the analog computing circuitry 5 to provide the analog computational function(s) required.

The circuitry 4 may be arranged so that the analog signals from one or more of the ports 7*, 8 or 9 may be operated on by the analog computing circuitry 5. In certain arrangements, the digital circuitry 6 may be arranged to enable the analog computer circuitry to operate selectively on either analog signals from first, second and third ports 7*, 8 or 9.

Alternatively, any of the analog signals received through the ports 7*, 8 or further port 9 may be received by the digital computing circuitry 6.

The inclusion of analog computing circuitry 5 is preferred as it allows for fast computation using a relatively small number of integrated electrical components.

The output of the analog circuitry may provide an output signal via output 4A of the controller circuitry 4 in order to control the BJT 2. Alternatively, the circuitry may be arranged to provide a digital output signal (e.g. pulse width modulated signal) via output 4A to control the BJT 2.

In addition to selecting which analog functions (mathematical operations) e.g. one or more of addition, subtraction, inversion, multiplication, integration, exponentiation, division, logarithm and differentiation, are performed by the analog circuitry 5. The digital circuitry may also be arranged to select between electrical components of the analog circuitry, e.g., select between capacitors of different capacitances or resistors of different resistances, in order to alter the variables of the computation. Where the digital circuitry provides a CPU function, selection of components to alter variables may be carried out dynamically using registers.

In a variant embodiment where analog computing circuitry is not used and instead digital computing circuitry is used alone, computations made from the inputs through ports 7*, 8 or 9 will be undertaken using algorithms and registers of the digital computing circuitry.

When analog computing is used either alone or in conjunction with digital circuitry, the OTP can be used to store analog values which may be used as further inputs for the mathematical functions applied to the input signals, or to control functions, e.g., period of analog counters.

The digital or analog circuitry may comprise sub-circuits that provide additional functions such as timers, temperature sensors.

In the preferred embodiment, where the device is used as a switch in a power circuit, the lateral size of the BJT is significantly greater than the total lateral size of the controller circuitry. The BJT 2 may have a lateral size that is at least 4 times greater than the individual electronic components, e.g. transistors, diodes, resistors and capacitors that form the controller circuitry 4.

The controller circuitry 4 may be powered through ports 8 and/or 9 with port 7 connected to the negative supply rail, or alternatively through a voltage across ports 8 and 9. Further detail of the manner in which this may be achieved is described below with reference to FIG. 7.

A resistor between the transistor's 2 base and collector allows the transistor to be kept on and hence the controller circuitry 4 powered. In this instance the output 4A of the controller 4 primary functions to switch the transistor off when required.

In certain arrangements the device may comprise two transistors arranged as a Darlington pair.

The inclusion of analog computing circuitry allows for very simple arrangements of controller circuitry 4 that avoids the problems associated with ensuring a power supply is maintained to the controller circuitry in order, for example, to power volatile memory, digital program counters and registers, etc.

Nevertheless, in embodiments of the device, e.g., those that comprise volatile memory, a storage capacitance (e.g. a capacitor) may be used to keep the control powered when there is no external power available.

FIG. 2 illustrates a variant transistor device 1' comprising a PNP bipolar junction transistor (BJT) 2'. The primary difference of this variant to that of FIG. 1 is that the controller circuitry 4' is constructed to reference positive voltage rather than ground to enable high side switching. As such the device has a first ports 7' 7'* that connect to the emitter side of the BJT 2' in order to receive an analog signal indicative of the current through the BJT 2' and a second port 8' that connects to the collector side of the BJT 2 in order to receive the voltage at the collector side of the BJT 2' relative to the emitter side (or some other reference point).

Figure 4:
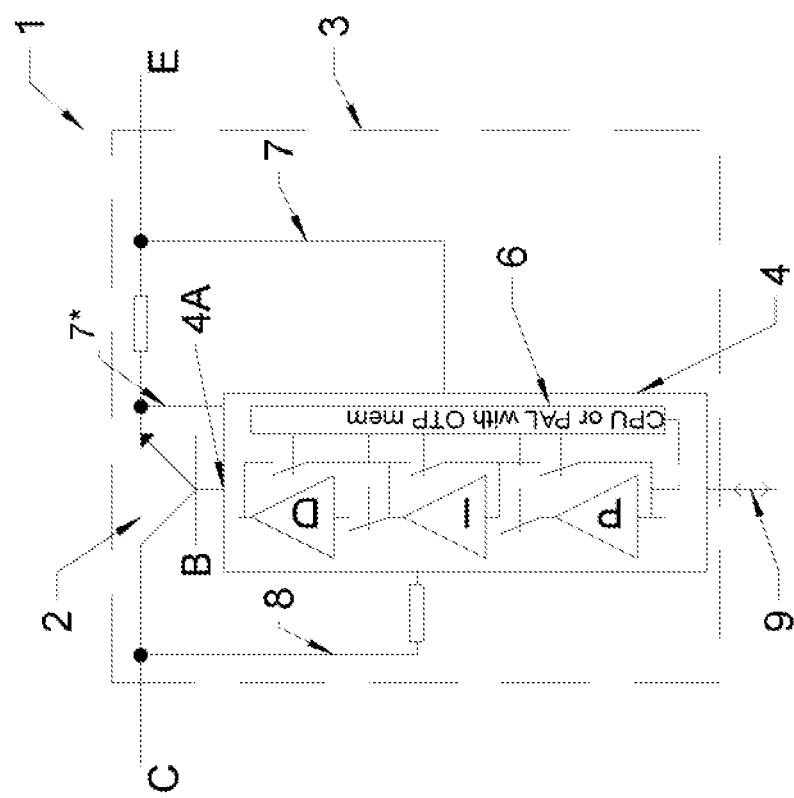
FIG. 4 is a schematic of a further variant NPN bipolar junction transistor device programmed to provide the function of the PID controller comprising both analog and digital computing circuitry.

FIGS. 3 & 4 illustrate variant NPN transistor devices showing different example arrangements of controller circuitry.

In the variant of FIG. 3 the controller circuitry 4 comprises only analog computing circuitry 5 which in this arrangement has been programmed to provide functions of a PID (proportional-integral-derivative) feedback mechanism.

The analog computer circuitry 5 may comprise a non-volatile analog memory, e.g. OTP memory, for initial configuration of the circuits or to hold values used in computations, e.g. the K values (tuning constants Kp, Ki, Kd used in PID controller) or in functions such as analog clock mechanism.

The OTP may be comprised from degradable electronic devices. This can be used to provided either analog or digital memory elements. In one example, the OTP may be comprised from an array of degradable bipolar junction transistors. In a non-degraded state the transistor is consider to hold a first value, e.g., 1, and in a degraded state the transistor is considered to hold a second value, e.g., 0. The transistors within the array can be selectively degraded in order to store a program within the memory. In one example a transistor of the array may be degraded by applying voltage of reverse polarity to the base terminal of the transistor of a magnitude that degrades the transistor such as to permanently reduce the transistor's gain value. In another variant, the array be comprised from polysilicon resistors through which an over-rated current is passed to alter their resistance.

Because the transistor gain value (where transistor's used) or resistance value (where resistors used) can be degraded in a graduated fashion, they are each also capable of holding an analog value to provide an analog memory.

Figure 5:
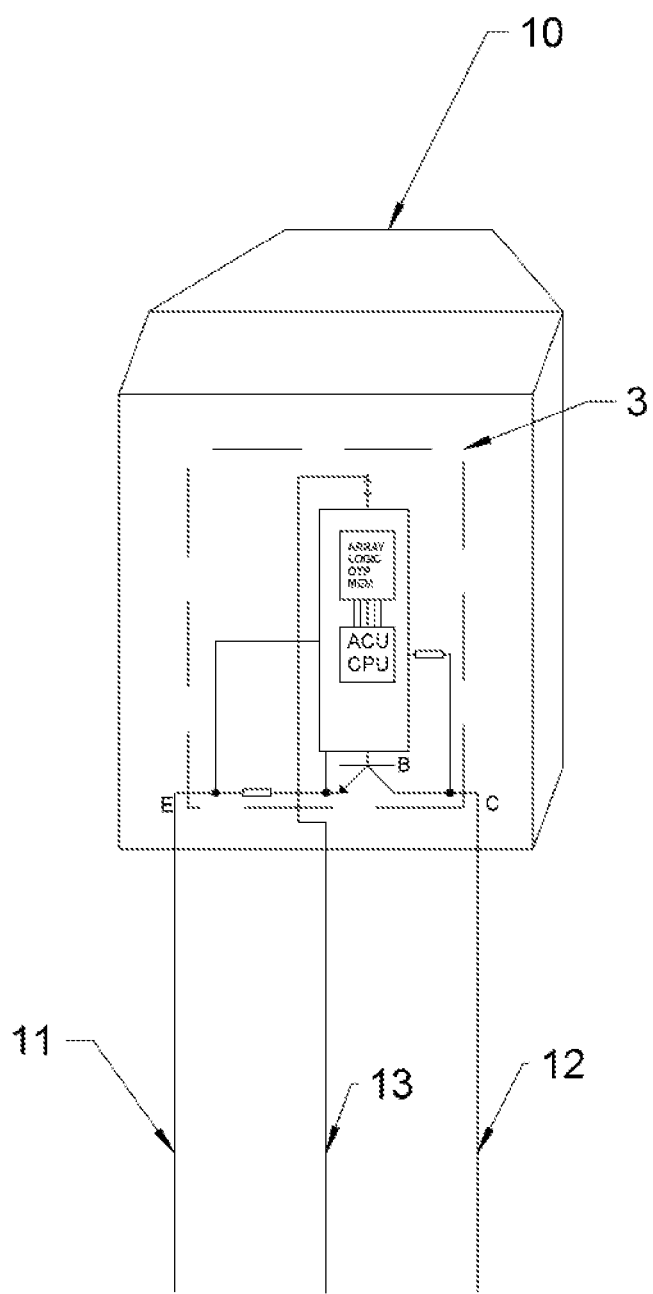
FIG. 5 is a perspective view of a discrete bipolar junction transistor device.

FIG. 4 shows a variant in which in addition to computing circuitry 5 providing the functions of a PID feedback mechanism, the controller circuitry further comprises a digital CPU or programmable logic device and O.TP memory that can be used to select which (if not all) of the proportional control, integral and derivative functions are to be applied.

Where the device of FIG. 1 or 2 is a discrete component, as illustrated in FIG. 5, the device includes a housing 10, of any desired shape, that encases (typically molded around) the chip 3, an emitter connector 11 connected to the emitter terminal E and a collector connector 12 connected to the collector terminal C. The connectors connect to the chip 3 and protrude out of the housing 10 in order to provide means to connect the discrete device 1 into a circuit.

The device of FIG. 5 also comprises a third connector 13 that extends out of the housing 10 in order to provide connection between the third input 9 of the controller circuitry 4 and an external signal source. In a variant design for use where the device may be operated without input signals into a third port 9, the device may be formed with two pins 11 12 for connection to emitter and collector only.

In an alternative arrangement where multiple integrated transistor devices 1 are formed on a single semiconductor monolith, at least some of the connections between inputs 9 may be provided by patterned metallization on the chip.

Figure 6:
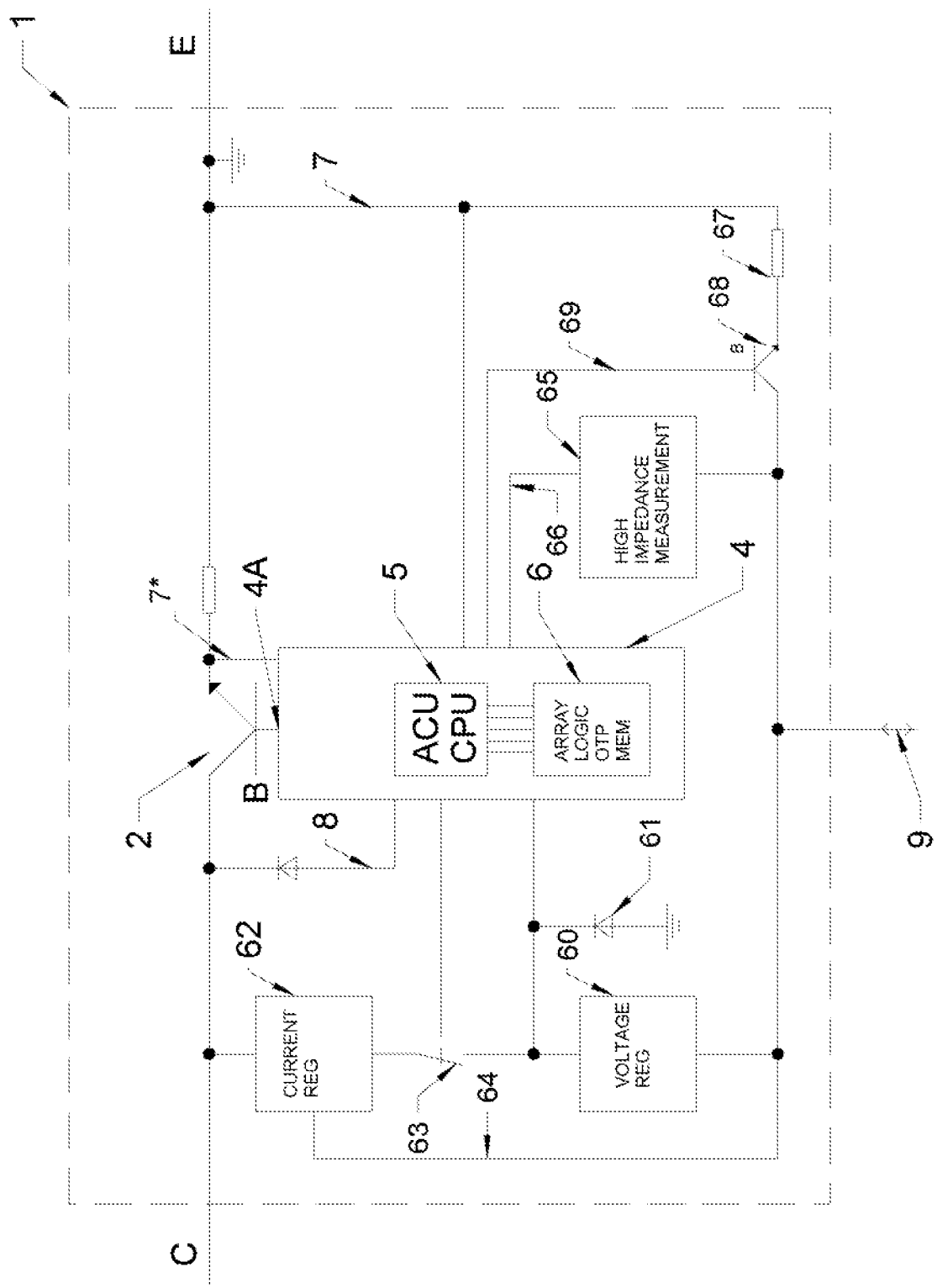
FIG. 6 is a schematic of a NPN bipolar junction transistor device showing circuitry used to power the controller circuitry.

FIG. 6 is a schematic of a NPN BJT transistor device 1 illustrating example power circuitry that enables the controller circuitry 4 to be powered through the device's connection to the external circuit on the collector side of the transistor 2 or via the third port 9. In addition FIG. 6 illustrates a circuit arrangement to allow the device to: a) receive an input data signal via port 9; and b) provide an output signal via port 9.

The device comprises a voltage regulator 60 which in association with a zener diode provides a regulated voltage from the third port 9 to power the controller circuitry 4.

The controller circuitry 4 can optionally be powered from the collector pin via current regulator 62. Because the voltage between the collector and emitter may be substantial—e.g., greater than 50V, which could be expected where the device is used in power driver applications, there is a risk that the current regulator may overheat . . . .

To guard against this, the circuit includes a switch 63 that can be enabled by the controller circuitry 4 when the voltage at the collector, as determined through first port 8, is below a safe voltage.

The current regulator 62 requires a small amount of power to function. In high voltage power applications it is more practicable to power the current regulator 62 from port 9 shown by connection 64, though in low power applications the current regulator may be powered via the collector pin.

The device further comprises a high impedance measurement element or sub-circuit, e.g., one or more of a resistor, reverse-biased diode or op-amp, that is connected between port 9 and a data input port 66 of the controller circuitry 4. The relatively high voltage at port 9 is dropped over the high impedance measurement element/sub-circuit 65 to provide a relatively low voltage data signal at input port 66.

The device further comprises data output circuitry that includes a pull down resistor 67 lying between port 9 and the emitter side of the transistor 2 and transistor switch 68. An output signal from output data port 69 is used to control transistor 68. To transmit a data signal out of port 9, a signal from output data port 69 is used to turn on transistor 68 which sinks a current through port 9 which can be used to transmit a signal, e.g. as a voltage drop seen by an external device connected to port 9.

Figure 7:
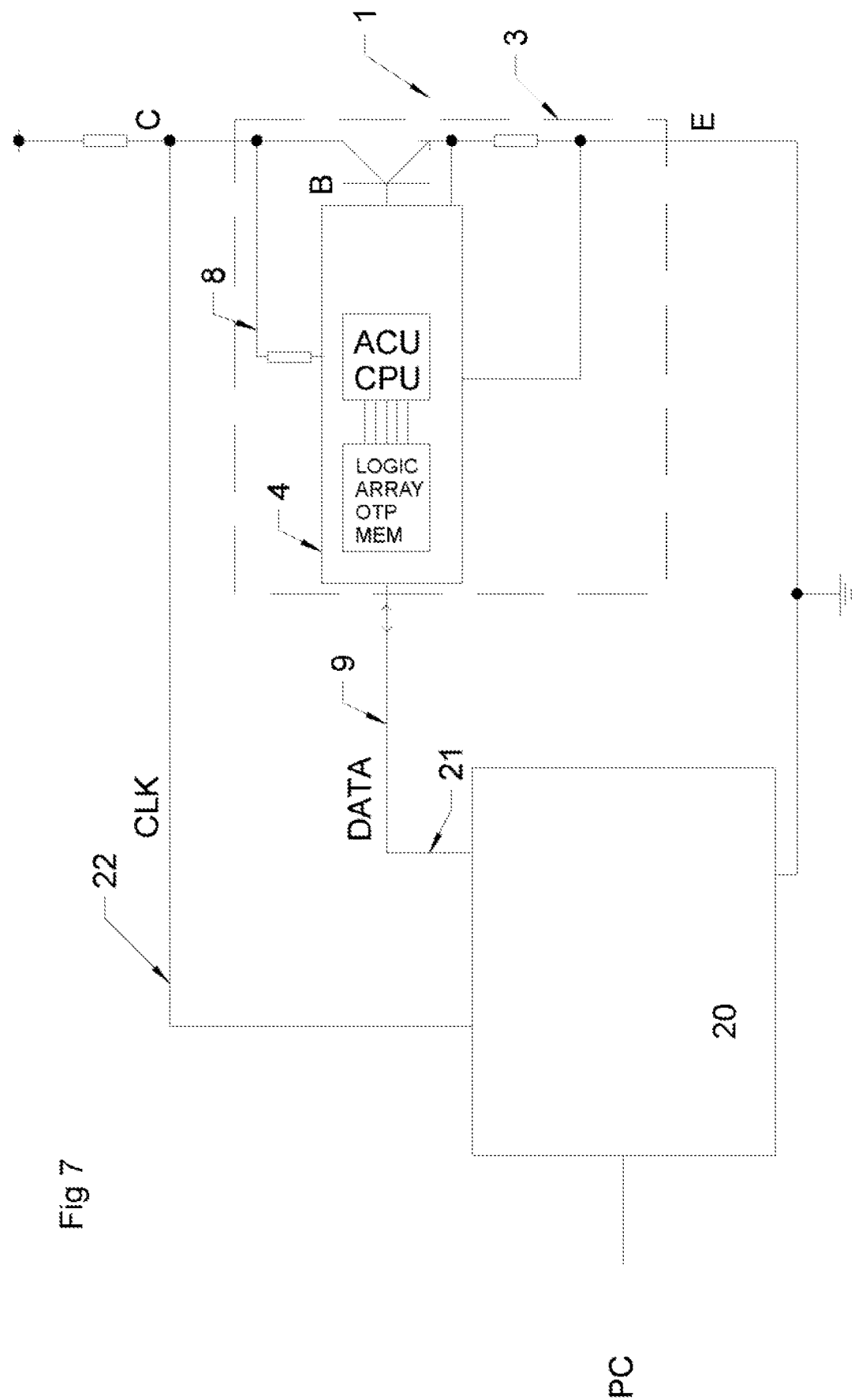
FIG. 7 is a schematic of the NPN transistor device of FIG. 1 connected to a one time program tool in order to program the digital computing circuitry.

FIG. 7 illustrates the device 1 of FIG. 1 connected to an external programming tool 20 to allow a user to program the chip 3 using an external computer. An output 21 of the tool 20 is connected to the third port 9 of the controller circuitry 4, which acts, when the controller circuitry 4 is in programming mode, as a data port. A second output 22 of the programming tool 20 is connected to the collector terminal in order that a clocking signal from the tool 20 can be received from the collector side by the controller circuitry 4 through the first port 8 to clock data into the controller circuitry 4. The one time memory function of the digital circuitry (though it could be of the circuitry) can then be programmed using conventional techniques.

As an alternative, data could instead be transferred via the second output 22 and port 8, and the clocking signal via first output 21 and port 9.

A variant tool is required to program a PNP transistor device adapted to account for the fact the emitter is referenced to the positive rail, as is the controller 20 and input 9). Programming tools for both NPN and PNP could be combined into a single external programming tool device.

Figure 8:
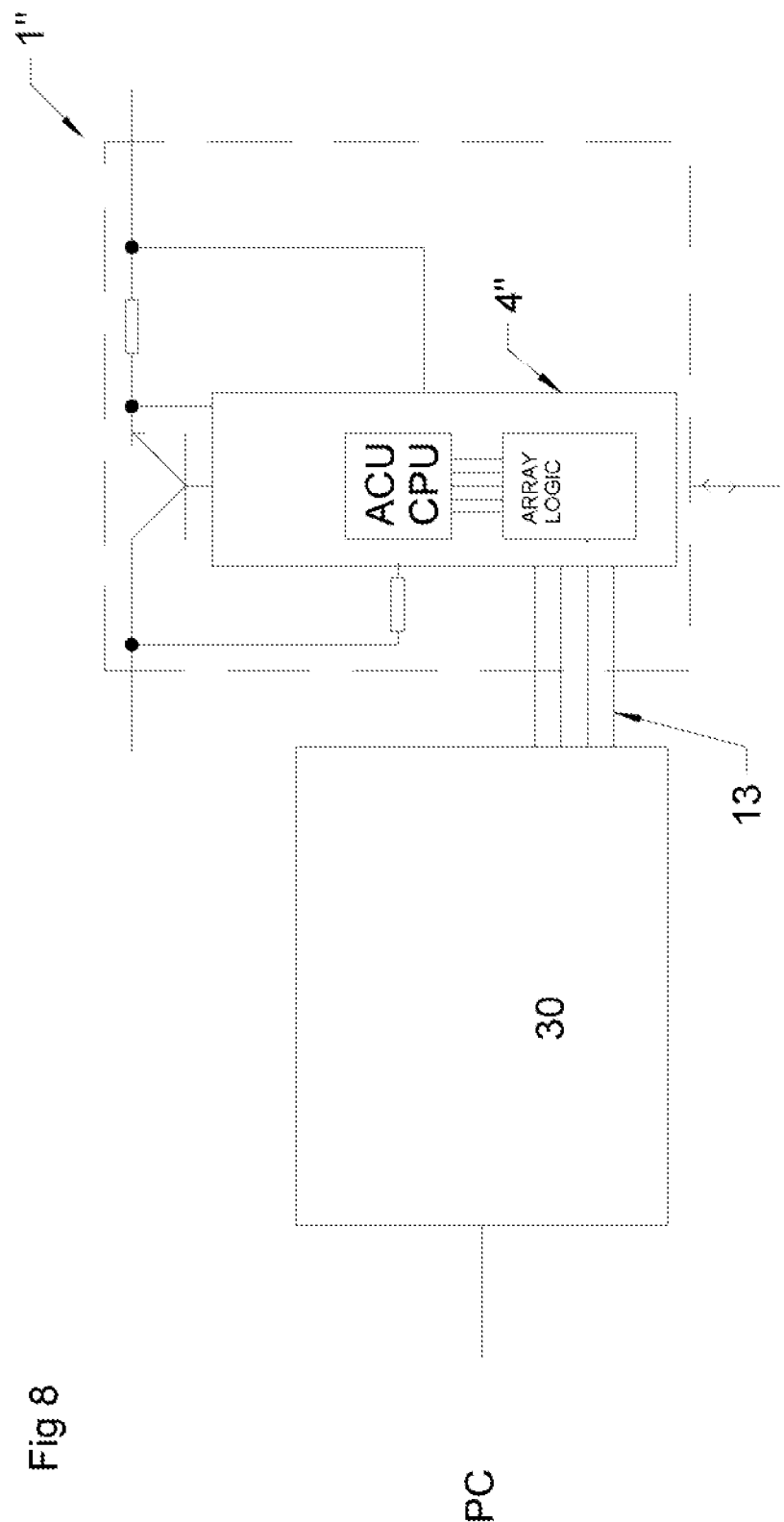
FIG. 8 is a schematic of a variant NPN transistor device adapted to be connected to an external debugging tool.

FIG. 8 is a schematic of a variant device 1" that omits the memory but has a number of further pin connectors 13 that connect additional ports of the controller circuitry 4" to an external debugging tool 30. The debugging tool comprises a reprogrammable memory that is used by controller circuitry 4" in place of the omitted OTP. The reprogrammable memory of the debugging tool allows for repeated programming of the device 1" from an external computer, e.g., P. C. This provides a convenient means for a programmer to test programs which are intended to be installed on the memory of the earlier described devices.

Optionally, a number of the pin connectors 13 may be used to output signals internal to the controller circuitry 4" such as for example, program counter values, control flags, RAM values (if RAM is present), etc.

An example application of the device variously described above is for use as, or as a part of a power management device. For example, the transistor device may form part of a power adapter for a LED lamp arranged to be connected to a mains (e.g. 120V or 240V AC) lighting circuit.

Figure 9:
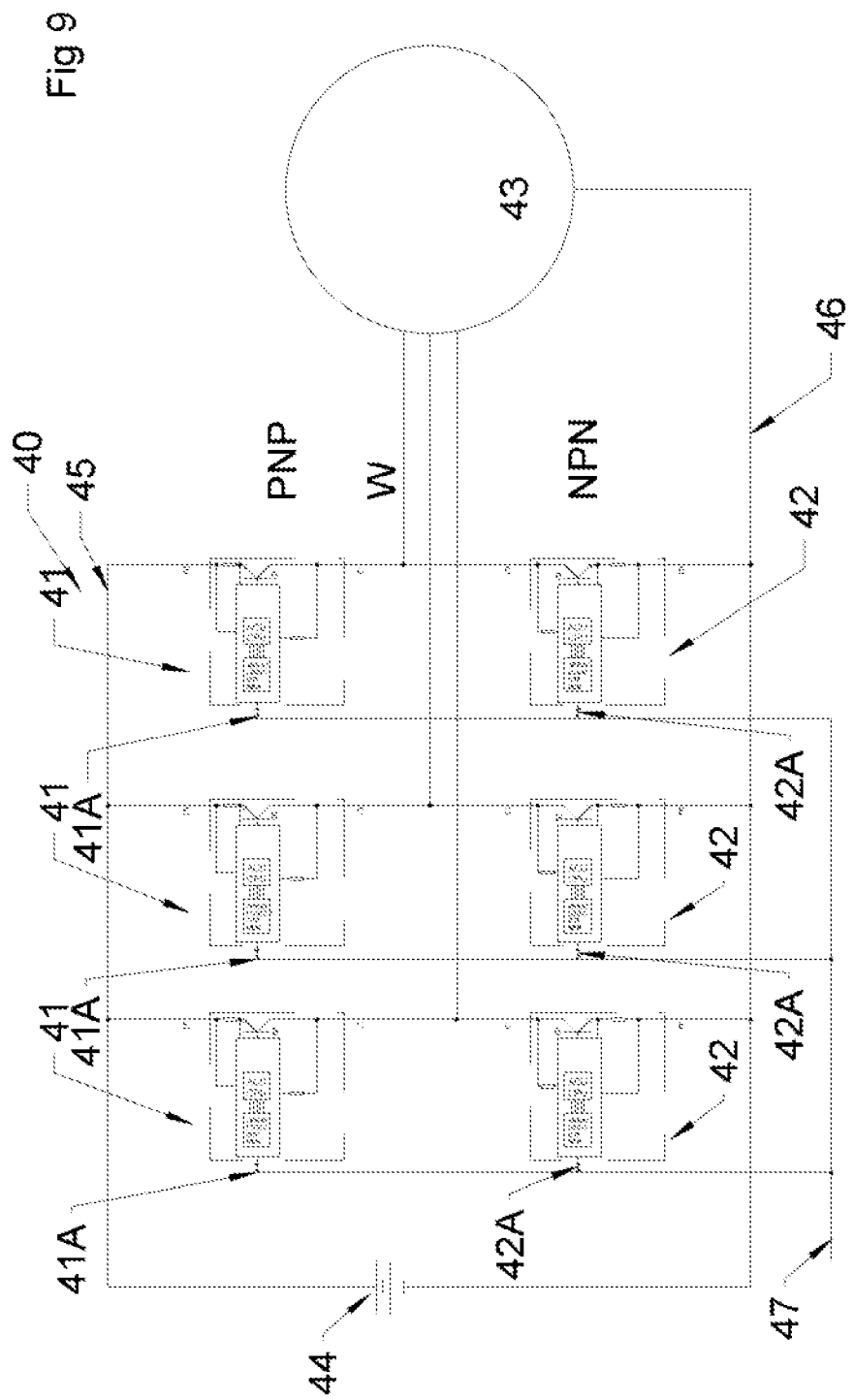
FIG. 9 is a schematic of a circuit comprising a three phase brushless DC electric motor, battery and driving circuit.

Another example application is illustrated in FIG. 9 that shows a schematic of a driving circuit 40 comprised of six bipolar junction transistor devices, three of NPN type 42 and three of PNP type 41 for powering a three phase brushless DC electric motor 43 from a battery 44. The three PNP devices 41 source from the positive rail 45, and three NPN transistor devices 42 switch to negative rail (ground) 46. The third port 41A, 42A of each of the devices 41,42 are connected together in order to receive a control signal (that may be a pulse width modulated signal or analog signal) via an input 47 from a controller or feedback device, e.g., an encoder associated with the motor 43 in which case the signal may be indicative of position or speed of the motor's rotor.

A pair of PNP, NPN devices 41 42 are each associated with a winding W of the motor 43. Through suitable programming of each of the devices 41, 42, the devices 41, 42, using the external input signal received via third port 41A, 42A, will control current flow through their respective motor winding in order to control the motor 43.

Figure 10:
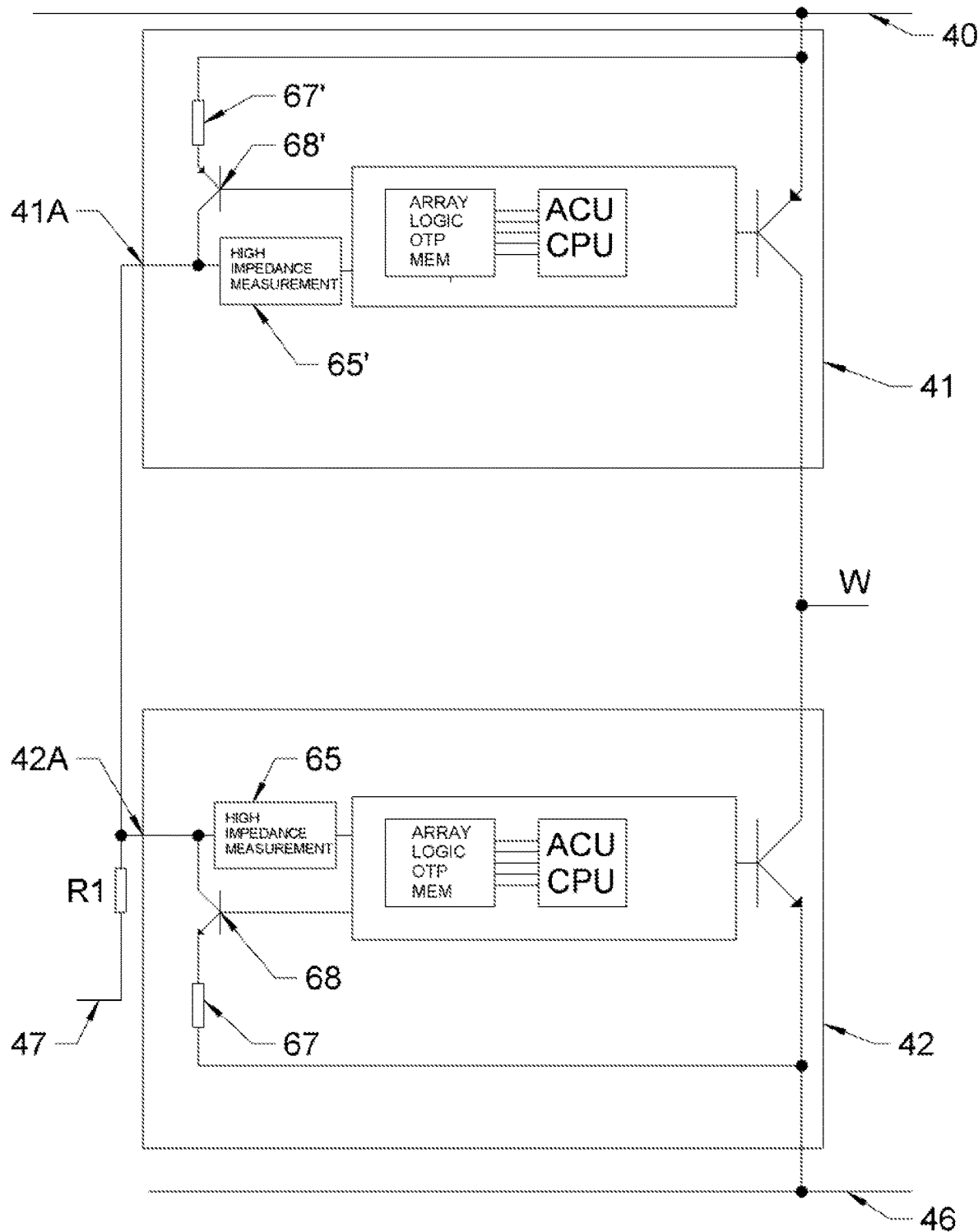
FIG. 10 is a schematic of a circuit that allows the low side transistor of a pair of the transistors of FIG. 9 to signal to the high side transistor of the pair.

FIG. 10 illustrates a variant circuit that allows communication between the NPN and the PNP of a pair of devices of FIG. 9 without affecting the control signal from input 47.

Where a high voltage from positive rail 45, e.g., greater than the control signal from input 47, is used to drive the motor 43, a controller 4 in a NPN 42 device may be arranged to signal via current level shifting to PNP 41 to effect switching of the PNP device 41.

The output port 42A of NPN device 42 can be pulled down to the emitter E via transistor 68 of the data output circuitry of the NPN device 42 thereby lowering the voltage at 42A. The potential divider circuit created through the resister arrangement of R1 (lying in a connection between the upper rail 40 and PNP device input 41A) & R2 (in line between PNP input 41A and NPN input 41A) results in corresponding voltage change at 41A. This voltage change is detected by the high impedance measurement circuit 65 of the PNP 41.

Resistor R3 sitting between NPN port 42A and the control input 47 ensures the act of pulling down the output port 42A to the emitter does not adversely affect the signal received from input 47 where could otherwise affect other device connected to input 47. The control input 47 ensures the act of pulling down the output port 42A to the emitter does not adversely affect the signal received from input 47 which could otherwise affect other device connected to input 47.

This configuration allows the NPN 42 to send commands to the PNP 41 such as, for example, to provide or change the size of a timing delay between the NPN 42 switching off and the PNP 41 switching on in order to prevent shorting circuiting the supply rails 40 and 46.

In a variant to the above described embodiments, the BJT 2 may be replaced with a FET, in such an arrangement the output 4A of the controller circuitry is connected to a gate terminal of the FET.

In a variant arrangement, the device may not include one or both of the first and second inputs and may instead be adapted to control the BJT using a signal received through the third port. In variants according to this arrangement the controller circuitry 4 would need to be factory programmed to provide the required function.

It will be appreciated that the above describes only a few example configurations of the analog computing circuitry and that the actual operations performed by the analog computing circuitry can be selected by the user depending on the intended function of the transistor device.

What is claimed is:

1. A discrete semiconductor transistor device comprising:
a transistor having a first terminal and a second terminal for connecting the transistor into an external circuit in order to control current flow through said external circuit, and a control terminal; and
a controller circuitry having an output that is connected to the control terminal of the transistor in order to control operation of the transistor, the controller circuitry comprising at least one input to allow the transistor device to receive control and/or data signals from an external source and in which the controller circuitry comprises electronic analog computing circuitry.

2. A discrete semiconductor transistor device according to claim 1, wherein the controller circuit comprises digital computing circuitry.

3. A discrete semiconductor transistor device according to claim 2, wherein the digital computing circuitry is programmable to select the setup of the electronic analog computing circuitry.

4. A discrete semiconductor transistor device according to claim 2, wherein the digital computing circuitry is one time programmable.

5. A discrete semiconductor transistor device according to claim 1, wherein the transistor is a high voltage transistor adapted to be connected via the first and second terminals into a high voltage circuit so as to control current flow through the high voltage circuit; and in which the controller circuitry operates using a relatively low voltage signal.

6. A discrete semiconductor transistor device according to claim 1, wherein the transistor and the controller circuitry are formed on a single semiconductor monolith.

7. A discrete semiconductor transistor device according to claim 1, wherein the controller circuitry has two inputs connected respectively to a first terminal side of the transistor and a second terminal side of the transistor to receive an indication of current through the transistor and an indication of voltage.

8. A discrete semiconductor transistor device according to claim 1 wherein the discrete semiconductor transistor device comprises a first connector, connecting to the first terminal of the transistor into a circuit, a second connector for connecting the second terminal of the transistor into the circuit and a third connector for connecting a further input of the controller circuitry to an external signal source.

9. A discrete semiconductor transistor device according to claim 8 wherein the controller circuitry is arranged such that a signal received through one of the first connector, second connector or third connector is used as an input that is operated on by the electronic analog computing circuitry and is also used to power the digital computing circuitry.

10. A discrete semiconductor transistor device according to claim 8 wherein the device comprises power circuitry arranged to enable the digital computing circuitry to be powered from a signal received through one or more of the first connector, second connector or third connector.

11. A discrete semiconductor transistor device according to claim 8 comprising a voltage level shifting circuitry arranged to shift down the voltage input at any one of the first, second or third connectors for input to the controller circuitry.

12. A discrete semiconductor transistor device according to claim 1, wherein the transistor is a bipolar-junction transistor.

13. A discrete semiconductor transistor device according to claim 12 wherein
the controller circuitry has an output that is connected to a base of the bi-polar-junction transistor in order to control operation of the bipolar-junction transistor; and
the controller circuitry has inputs connected to an emitter side of the bipolar-junction transistor and a collector side of the bipolar-junction transistor in order to receive an indication of current through the bipolar-junction transistor and an indication of voltage.

14. A discrete semiconductor transistor device comprising:
a transistor having a first terminal and a second terminal for connecting the transistor into an external circuit in order to control current flow through said external circuit, and a control terminal;
a controller circuitry having an output that is connected to the control terminal of the transistor in order to control operation of the transistor, wherein the controller circuitry comprises electronic analog computing circuitry; and
wherein the transistor and controller circuitry are fabricated on a single semiconductor monolith.

15. A semiconductor transistor device comprising:
multiple transistors each having a first terminal and a second terminal and a control terminal; and
each of the multiple transistors having separate programmable controller circuitry associated therewith, each of the separate controller circuitry having an output that is connected to the control terminal of its respective transistor in order to control operation of its respective transistor, wherein the separate programmable controller circuitry comprises electronic analog computing circuitry.

16. The discrete semiconductor transistor device of claim 1, wherein the electronic analog computing circuitry is configured to perform one or more mathematical operations selected from the set of operations consisting of: addition, subtraction, inversion, multiplication, integration, exponentiation, division, logarithm and differentiation.

17. The discrete semiconductor transistor device of claim 1, wherein the electronic analog computing circuitry comprises a non-volatile analog memory that stores analog values electrically coupled to an input of the electronic analog computing circuitry, and the electronic analog computing circuitry has the output that is connected to the control terminal of the transistor.

* * * * *